(12) United States Patent
Meulen

(10) Patent No.: US 8,950,998 B2
(45) Date of Patent: Feb. 10, 2015

(54) BATCH SUBSTRATE HANDLING

(75) Inventor: Peter van der Meulen, Newburyport, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 385 days.

(21) Appl. No.: 12/106,975

(22) Filed: Apr. 21, 2008

(65) Prior Publication Data

US 2008/0260500 A1      Oct. 23, 2008

Related U.S. Application Data

(63) Continuation-in-part of application No. 11/679,829, filed on Feb. 27, 2007, now abandoned.

(60) Provisional application No. 60/913,257, filed on Apr. 20, 2007.

(51) Int. Cl.
| | | |
|---|---|---|
| *H01L 21/67* | (2006.01) | |
| *B65G 25/02* | (2006.01) | |
| *B25J 9/16* | (2006.01) | |
| *G05B 19/418* | (2006.01) | |
| *B65G 37/00* | (2006.01) | |
| *H01L 21/677* | (2006.01) | |
| *H01L 21/687* | (2006.01) | |

(52) U.S. Cl.
CPC ............... *B65G 25/02* (2013.01); *B25J 9/161* (2013.01); *G05B 19/41865* (2013.01); *H01L 21/67276* (2013.01); *H01L 21/67167* (2013.01); *B65G 37/00* (2013.01); *H01L 21/67742* (2013.01); *H01L 21/68707* (2013.01); *Y10S 414/139* (2013.01); *Y10S 706/904* (2013.01)
USPC ......... 414/217; 414/744.6; 414/939; 706/904

(58) Field of Classification Search
None
See application file for complete search history.

(56) References Cited

U.S. PATENT DOCUMENTS

| | | | | |
|---|---|---|---|---|
| 4,664,578 A | | 5/1987 | Kakehi | |
| 4,884,216 A | * | 11/1989 | Kuperstein | .................... 700/259 |
| 5,019,233 A | | 5/1991 | Blake et al. | |
| 5,076,205 A | * | 12/1991 | Vowles et al. | ................. 118/719 |
| 5,135,349 A | * | 8/1992 | Lorenz et al. | .............. 414/744.6 |
| 5,292,393 A | * | 3/1994 | Maydan et al. | .......... 156/345.32 |
| 5,364,222 A | * | 11/1994 | Akimoto et al. | ......... 414/416.03 |
| 5,442,730 A | * | 8/1995 | Bigus | .............................. 706/19 |
| 5,447,409 A | * | 9/1995 | Grunes et al. | .............. 414/744.6 |
| 5,474,410 A | | 12/1995 | Ozawa et al. | |
| 5,558,482 A | | 9/1996 | Hiroki et al. | |
| 5,566,275 A | * | 10/1996 | Kano | ............................ 700/246 |
| 5,606,646 A | * | 2/1997 | Khan et al. | ........................ 706/2 |

(Continued)

FOREIGN PATENT DOCUMENTS

DE          43 33 820 A1  *  4/1994  ................. B25J 9/18

OTHER PUBLICATIONS

Hesselroth et al, Neural Network Control of a Pneumatic Robot Arm, IEEE, pp. 28-34, 1994.*

*Primary Examiner* — James Keenan
(74) *Attorney, Agent, or Firm* — Perman & Green, LLP; Colin C. Durham

(57) ABSTRACT

A substrate-handling vacuum robot includes a first robotic arm with a single-substrate end effector and a second robotic arm with a batch end effector. The single-substrate end effector permits single-substrate pick-and-place operations while the batch end effector permits batch handling of substrates within a vacuum environment.

16 Claims, 5 Drawing Sheets

(56) References Cited

U.S. PATENT DOCUMENTS

| | | | |
|---|---|---|---|
| 5,943,659 A * | 8/1999 | Giles et al. ........................ 706/2 |
| 5,989,346 A | 11/1999 | Hiroki |
| 6,048,162 A * | 4/2000 | Moslehi .................... 414/744.6 |
| 6,059,507 A | 5/2000 | Adams |
| 6,074,443 A * | 6/2000 | Venkatesh et al. ............ 700/101 |
| 6,132,165 A * | 10/2000 | Carducci .................... 414/744.5 |
| 6,203,268 B1 | 3/2001 | Miyashita |
| 6,256,555 B1 * | 7/2001 | Bacchi et al. ................ 700/245 |
| 6,270,306 B1 | 8/2001 | Otwell et al. |
| 6,299,404 B1 * | 10/2001 | Muka et al. ................ 414/744.5 |
| 6,312,525 B1 * | 11/2001 | Bright et al. ................ 118/719 |
| 6,366,830 B2 | 4/2002 | Bacchi et al. ................ 700/250 |
| 6,374,144 B1 * | 4/2002 | Viviani et al. ................ 700/12 |
| 6,379,095 B1 * | 4/2002 | Elliott et al. ................ 414/279 |
| 6,481,956 B1 * | 11/2002 | Hofmeister ................ 414/806 |
| 6,584,369 B2 * | 6/2003 | Patel et al. .................... 700/100 |
| 6,632,065 B1 * | 10/2003 | Cameron et al. ......... 414/416.03 |
| 6,669,434 B2 | 12/2003 | Namba et al. |
| 6,725,114 B1 * | 4/2004 | Jevtic ........................... 700/100 |
| 6,802,934 B2 | 10/2004 | Saeki et al. |
| 6,941,199 B1 * | 9/2005 | Bottomley et al. ............. 701/23 |
| 6,979,165 B2 | 12/2005 | Larson et al. |
| 7,025,554 B2 | 4/2006 | Ozawa et al. |
| 7,230,441 B2 * | 6/2007 | Carlson-Stevermer ....... 324/765 |
| 7,293,950 B2 | 11/2007 | Bonora et al. |
| 7,769,482 B2 * | 8/2010 | Pannese et al. ................ 700/121 |
| 7,815,739 B2 | 10/2010 | Matsuura |
| 8,442,667 B2 * | 5/2013 | Pannese ...................... 700/121 |
| 2001/0048867 A1 | 12/2001 | Lebar et al. |
| 2001/0053324 A1 | 12/2001 | Saeki et al. |
| 2002/0006323 A1 | 1/2002 | Yoshida et al. |
| 2003/0088530 A1 * | 5/2003 | Ramanan ........................ 706/13 |
| 2003/0171972 A1 * | 9/2003 | Heskin ............................... 705/9 |
| 2004/0062627 A1 | 4/2004 | Aggarwal et al. |
| 2005/0118000 A1 | 6/2005 | Kasai et al. |
| 2006/0099063 A1 | 5/2006 | Pietrantonio et al. |
| 2006/0156979 A1 * | 7/2006 | Thakur et al. ................ 118/715 |
| 2007/0141748 A1 * | 6/2007 | Rice ............................ 438/106 |
| 2007/0160447 A1 | 7/2007 | Amikura et al. |
| 2008/0138175 A1 | 6/2008 | Mitchell et al. |

\* cited by examiner

BATCH SUBSTRATE HANDLING

RELATED APPLICATIONS

This application is a continuation-in-part of U.S. application Ser. No. 11/679,829 filed on Feb. 27, 2007, and this application claims the benefit of U.S. Provisional Application No. 60/913,257 filed Apr. 20, 2007. The entire content of each of these applications is hereby incorporated by reference.

BACKGROUND

This application relates to robots. There remains a need for robots capable of handling substrates in a heterogeneous vacuum processing environment.

SUMMARY

A substrate-handling vacuum robot includes a first robotic arm with a single-substrate end effector and a second robotic arm with a batch end effector. The single-substrate end effector permits single-substrate pick-and-place operations while the batch end effector permits batch handling of substrates within a vacuum environment.

As used herein, "robot" shall include any kind of known robot or similar device or facility that includes a mechanical capability and a control capability, which may include a combination of a controller, processor, computer, or similar facility, a set of motors or similar facilities, one or more resolvers, encoders or similar facilities, one or more mechanical or operational facilities, such as arms, wheels, legs, links, claws, extenders, grips, nozzles, sprayers, end effectors, actuators, and the like, as well as any combination of any of the above. One embodiment is a robotic arm.

As used herein "drive" shall include any form of drive mechanism or facility for inducing motion. In embodiments it includes the motor/encoder section of a robot.

As used herein, "axis" shall include a motor or drive connected mechanically through linkages, belts or similar facilities, to a mechanical member, such as an arm member. An "N-axis drive" shall include a drive containing N axes; for example a "2-axis drive" is a drive containing two axes.

As used herein, "arm" shall include a passive or active (meaning containing motors/encoders) linkage that may include one or more arm or leg members, bearings, and one or more end effectors for holding or gripping material to be handled.

As used herein, "SCARA arm" shall mean a Selectively Compliant Assembly Robot Arm (SCARA) robotic arm in one or more forms known to those of skill in the art, including an arm consisting of one or more upper links connected to a drive, one or more lower links connected through a belt or mechanism to a motor that is part of the drive, and one or more end units, such as an end effector or actuator.

As used herein, "turn radius" shall mean the radius that an arm fits in when it is fully retracted.

As used herein, "reach" shall include, with respect to a robotic arm, the maximum reach that is obtained when an arm is fully extended. Usually the mechanical limit is a little further out than the actual effective reach, because it is easier to control an arm that is not completely fully extended (in embodiments there is a left/right singularity at full extension that can be hard to control).

As used herein, "containment" shall mean situations when the arm is optimally retracted such that an imaginary circle can be drawn around the arm/end effector/material that is of minimum radius.

As used herein, the "reach-to-containment ratio" shall mean, with respect to a robotic arm, the ratio of maximum reach to minimum containment.

As used herein, "robot-to-robot" distance shall include the horizontal distance between the mechanical central axes of rotation of two different robot drives.

As used herein, "slot valve" shall include a rectangular shaped valve that opens and closes to allow a robot arm to pass through (as opposed to a vacuum (isolation) valve, which controls the pump down of a vacuum chamber). For example, the SEMI E21.1-1296 standard (a published standard for semiconductor manufacturing) the slot valve for 300 mm wafers in certain semiconductor manufacturing process modules has an opening width of 336 mm, a opening height of 50 mm and a total valve thickness of 60 mm with the standard also specifying the mounting bolts and alignment pins.

As used herein, "transfer plane" shall include the plane (elevation) at which material is passed from a robot chamber to a process module chamber through a slot valve. Per the SEMI E21.1-1296 standard for semiconductor manufacturing equipment the transfer plane is 14 mm above the slot valve centerline and 1100 mm above the plane of the factory floor.

As used herein, "section" shall include a vacuum chamber that has one or more robotic drives in it. This is the smallest repeatable element in a linear system.

As used herein, "link" shall include a mechanical member of a robot arm, connected on both ends to another link, an end effector, or the robot drive.

As used herein, "L1," "L2", "L3" or the like shall include the numbering of the arm links starting from the drive to the end effector.

As used herein, "end effector" shall include an element at an active end of a robotic arm distal from the robotic drive and proximal to an item on which the robotic arm will act. The end effector may be a hand of the robot that passively or actively holds the material to be transported in a semiconductor process or some other actuator disposed on the end of the robotic arm.

As used herein, the term "SCARA arm" refers to a robotic arm that includes one or more links and may include an end effector, where the arm, under control, can move linearly, such as to engage an object. A SCARA arm may have various numbers of links, such as 3, 4, or more. As used herein, "3-link SCARA arm" shall include a SCARA robotic arm that has three members: link one (L1), link two (L2) and an end effector. A drive for a 3-link SCARA arm usually has 3 motors: one connected to L1, one to the belt system, which in turn connects to the end effector through pulleys and a Z (lift) motor. One can connect a fourth motor to the end effector, which allows for some unusual moves not possible with only three motors.

As used herein, "dual SCARA arm" shall include a combination of two SCARA arms (such as two 3 or 4-link SCARA arms (typically designated A and B)) optionally connected to a common drive. In embodiments the two SCARA arms are either completely independent or share a common link member L1. A drive for a dual independent SCARA arm usually has either five motors: one connected to L1-A, one connected to L1-B, one connected to the belt system of arm A, one connected to the belt system of arm B, and a common Z (lift) motor. A drive for a dual dependent SCARA arm usually has a common share L1 link for both arms A and B and contains typically four motors: one connected to the common link L1, one connected to the belt system for arm A, one connected to the belt system for arm B, and a common Z (lift) motor.

As used herein, "4-link SCARA arm" shall include an arm that has four members: L1, L2, L3 and an end effector. A drive for a 4-link SCARA arm can have four motors: one connected to L1, one to the belt systems connected to L2 and L3, one to the end effector and a Z motor. In embodiments only 3 motors are needed: one connected to L1, one connected to the belt system that connects to L2, L3 and the end effector, and a Z motor.

As used herein, "Frog-leg style arm" shall include an arm that has five members: L1A, L1B, L2A, L3B and an end effector. A drive for a frog-leg arm can have three motors, one connected to L1A—which is mechanically by means of gearing or the like connected to L1B-, one connected to a turret that rotates the entire arm assembly, and a Z motor. In embodiments the drive contains three motors, one connected to L1A, one connected to LIB and a Z motor and achieves the desired motion through coordination between the motors.

As used herein, "Dual Frog-leg style arm" shall include an arm that has eight members L1A, L1B, L2A-1, L2A-2, L2B-1, L2B-2 and two end effectors. The second link members L2A-1 and L2B-1 form a single Frog-leg style arm, whereas the second link members L2A-2 and L2B-2 also form a single Frog-leg style arm, however facing in an opposite direction. A drive for a dual frog arm may be the same as for a single frog arm.

As used herein, "Leap Frog-leg style arm" shall include an arm that has eight members L1A, L1B, L2A-1, L2A-2, L2B-1, L2B-2 and two end effectors. The first link members L1A and L1B are each connected to one of the motors substantially by their centers, rather than by their distal ends. The second link members L2A-1 and L2B-1 form a single Frog-leg style arm, whereas the second link members L2A-2 and L2B-2 also form a single Frog-leg style arm, however facing in the same direction. A drive for a dual frog arm may be the same as for a single frog arm.

BRIEF DESCRIPTION OF THE FIGURES

The foregoing and other objects and advantages of the invention will be appreciated more fully from the following further description thereof, with reference to the accompanying drawings, wherein.

DETAILED DESCRIPTION

Various equipment architectures are used for handling semiconductor wafers, reticles, disc media (CD's, DVD's, HD-DVD's, Blu-ray, etc.) and any other generally planar media in a vacuum processing environment, all referred to generally herein as "substrates". Each type of manufacturing equipment handles substrates and transports the substrates among various processes, such as chemical vapor deposition processes, etching processes, cleaning processes, and the like. Many such processes are extremely sensitive to contaminants, such as particulates and volatile organic compounds, so vacuum handling is employed, along with various isolated process modules devoted to specific processes. Some vacuum handling systems and process modules are configured to handle substrates in batches, while other vacuum handling systems and process modules are configured to handle individual substrates. It may be efficient or useful under certain circumstances to have one or more non-batch or single wafer process modules incorporated into a system where process times are suitably proportional to provide acceptable utilization of the single and batch process modules in cooperation. The robotic handler described below permits improved flexibility in the interconnection of single-substrate and batch processing components.

Figure 1:
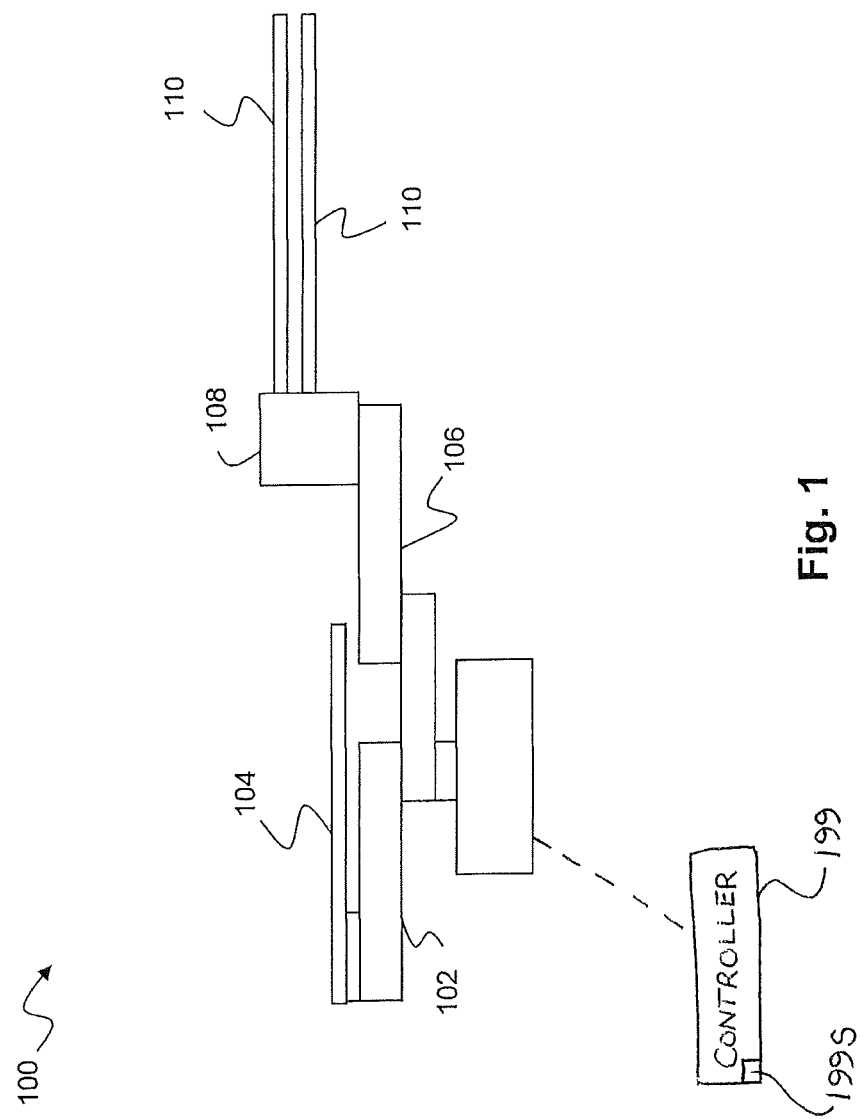
FIG. 1 shows a cross-sectional view of a robotic arm for use in a vacuum substrate handling system.

FIG. 1 shows a cross-sectional view of a robotic arm for use in a vacuum substrate handling system. A robot 100 may include a first robotic arm 102 with an end effector 104, and a second robotic arm 106 with a batch end effector 108.

As depicted, the first robotic arm 102 is a single link SCARA unit, and the second robotic arm 106 is a two-link SCARA unit. However, each one of the robotic arms 102, 106 may be, for example, a SCARA-type unit with any suitable number of arm links, or any other robotic arm or other robot suitable for handling substrates in a vacuum environment. In other embodiments, the first robotic arm 102 or the second robotic arm 106 may be a frog-leg-style arm, dual frog-leg-style arm, leap frog-leg-style arm (the foregoing collectively referred to herein as a "frog-leg-style arm"), Cartesian movement arm, telescoping arm, or any other type of robot arm suitable for handling substrates in a vacuum environment. In addition, depending on particular deployments of manufacturing processes, the two arms 102, 106 may be fully independent, or partially or selectively dependent. In embodiments, either or both of the two arms 102, 106 may have z-movement capability. This may significantly expand to flexibility of the overall system, such as by permitting the first robotic arm 102 to access any one of a number of vertically-stacked shelves in a batch processing module or other device, or by permitting vertical stacking of batch processing devices within a vacuum environment. All such variations are intended to fall within the scope of this disclosure.

The end effector 104 may be a conventional end effector, or any other hardware suitable for handling a substrate.

The batch end effector 108 may have a number of vertically-stacked, single-substrate effectors 110 in a fixed orientation relative to one another. In embodiments, the single-substrate effectors 110 may be vertically aligned, or the single-substrate effectors 110 may be vertically offset, according to the physical configuration of a batch processing device that the second robotic arm 106 services. In embodiments, the second robotic arm 106 may have two single-substrate effectors 110 as depicted. However, it will be understood that any suitable number of effectors may be employed such as three effectors, four effectors, or any other number of effectors. In still further embodiments, the batch end effector 108 may employ various combinations of side-by-side effectors, vertically-stacked aligned effectors, vertically-stacked offset effectors, and so forth, again according to the physical configuration of devices serviced by the robot 100. All such variations are intended to fall within the scope of this disclosure.

Figure 2:
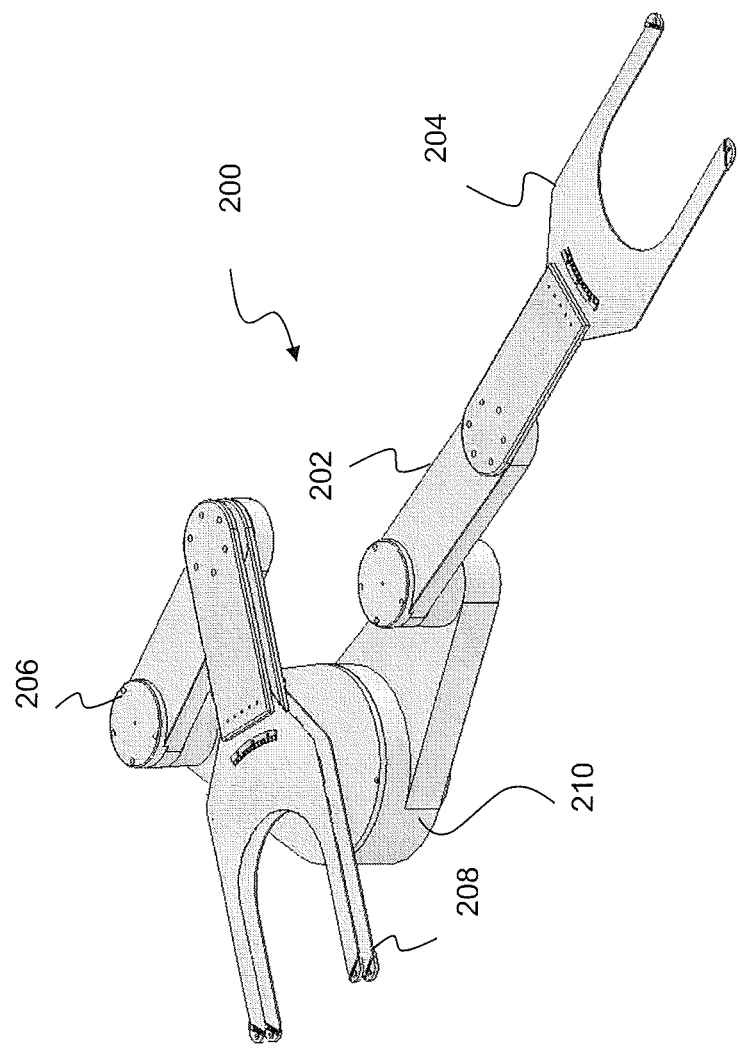
FIG. 2 shows a perspective view of a robotic arm for use in vacuum substrate handling system.

FIG. 2 shows a perspective view of a robotic arm for use in vacuum substrate handling system. As with the robot 100 of FIG. 1, the robot 200 of FIG. 2 employs a first robotic arm 202 with a single-substrate end effector 204 and a second robotic arm 206 with a batch end effector 208. In the embodiment of FIG. 2, the first robotic arm 202 may be a two-link SCARA unit and the second robotic arm 206 may be a two-link SCARA unit. The robotic arms 202, 206 may share a base 210 that houses electro-mechanical components to mechanically control movement of the robotic arms 202, 206. In one embodiment, the first link of each arm 202, 206 extending from the base 210 may be in a fixed radial orientation, and the base 210 may rotate to provide further maneuverability to the pair of arms 202, 206. In one embodiment, the first link of each arm 202, 206 may be independently positionable about a center axis of the base 210.

In embodiments the components of the system can be controlled by a software controller 199, which in embodiments may be a central controller that controls each of the components. In embodiments the components form a linkable handling system under control of the software, where the software controls each robot to hand off a material to another robot, a transfer station, a process module, a load lock, a buffer, or any other component of a vacuum processing system. A software scheduler 199S, such as a neural net-based, rule-based, or other scheduler, may be employed to coordinate actions of the robot with a vacuum handling system. In embodiments process modules, robots, and the like can make themselves known over a control network, so that the software controller knows what new process modules, robots, or other components have been connected. In embodiments the software system may include an interface that permits the user to run a simulation of the system.

As may be realized, using the robotic arm configuration described herein, the robotic arms may be controlled so that the single end effector 104 may be employed for individual picks and placements of wafers within modules while the batch end effector 108 may be employed for batch transfers between process modules via, e.g., batch buffers, robot-to-robot hand offs, or any other suitable batch processing technique.

Figure 3:
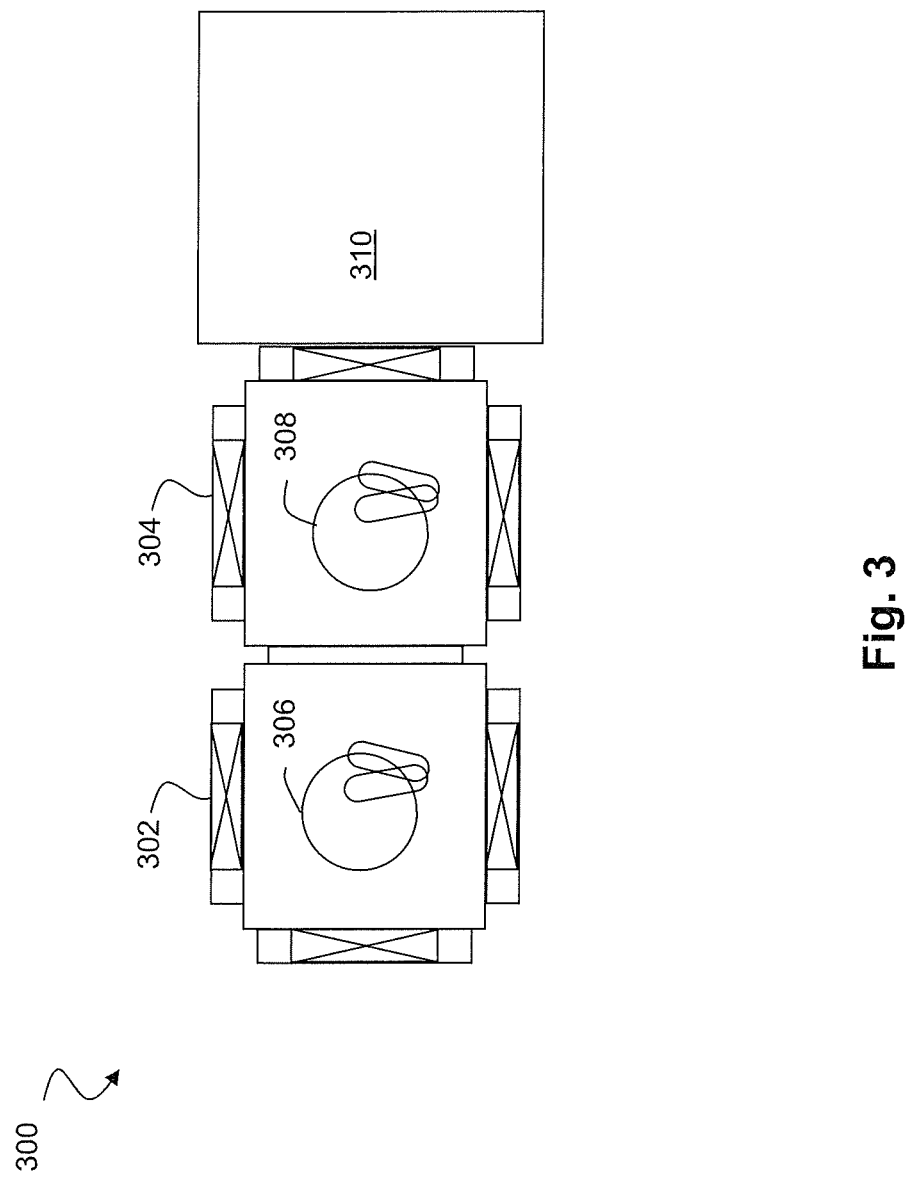
FIG. 3 shows a vacuum handling system using the robotic handlers of FIG. 1 and FIG. 2.

FIG. 3 shows a vacuum handling system using the robotic handlers of FIG. 1 and FIG. 2. In general, the system 300 includes one or more robotic handlers 302, 304, coupled together to create a shared vacuum environment. Each robotic handler 302, 304 may include one or more robots 306, 308 (depicted conceptually with a circular wafer on an end effector thereof), at least one of which may be any of the robots described above. The system 300 provides a number of facets to which various devices may be attached. For example, one of the robots 308 may be positioned to reach a device 310 attached thereto, which is shown for purposes of illustration and not by way of limitation as a device having a generally square footprint.

Figure 3A:
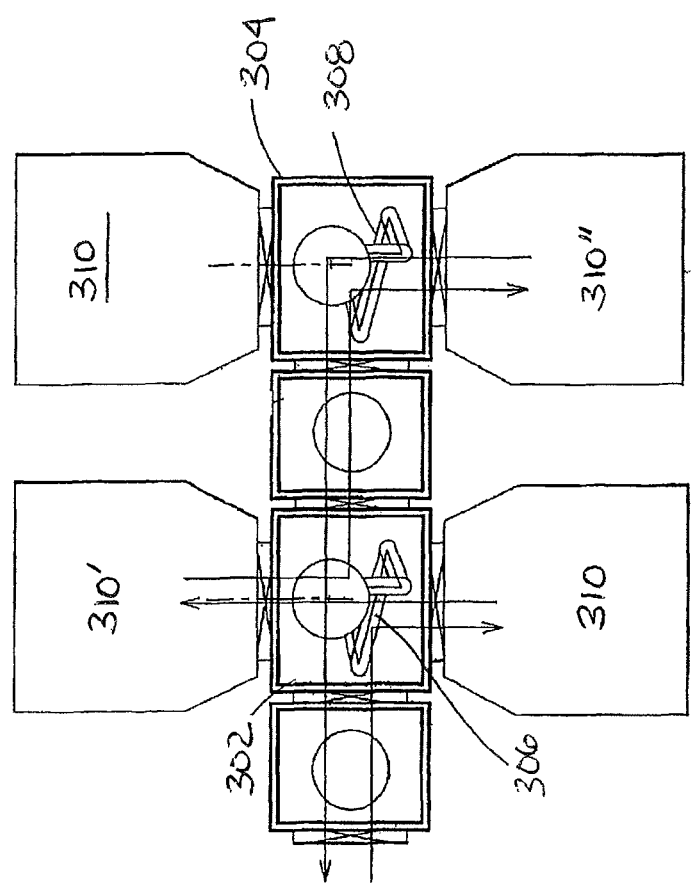
FIG. 3A shows a vacuum handling system using the robotic handlers of FIG. 1 and FIG. 2.

The device 310 may include any device or combination of devices useful for processing or handling a substrate. This may include, for example, a batch process module 310' (FIG. 3A), a batch load lock, and any other batch tool and/or system (including, without limitation, batch buffers, batch aligners, batch heaters, and so forth), as well as combinations of the foregoing. The device 310 may also, or instead, include any conventional or unconventional single-substrate process module 310" (FIG. 3A), load lock, and the like. While a single device 310 is depicted, it will be understood that each facet of the system 300 may be coupled to any one or more devices that may be combined together to form a vacuum processing system. In general, the use of single-substrate and batch end effectors permits various combinations of devices that can be optimized for floor space, throughput, or the like, or to maximize the variations in process steps that can be concurrently or sequentially performed on single or multiple wafers within a single physical system. In general, such devices are included in a vacuum system by coupling the devices to a shared vacuum system with the robot in a position that is within reach of one of the robotic arms thereof.

Figure 4A:
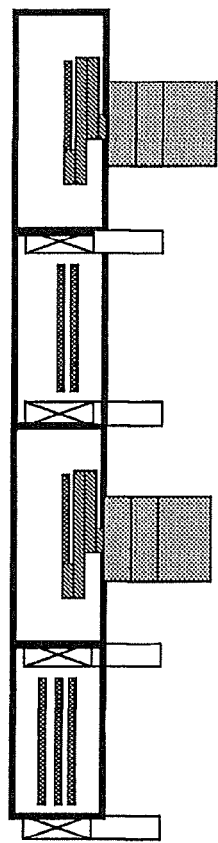
FIGS. 4A-4C show a multi-shelf buffer for use in a batch processing system.
Figure 4B:
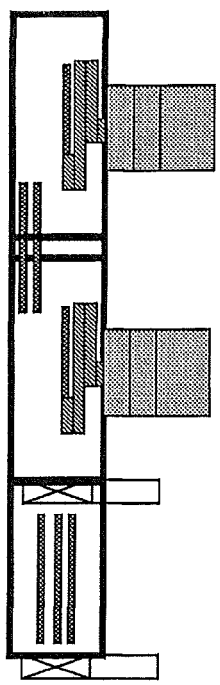
Figure 4C:
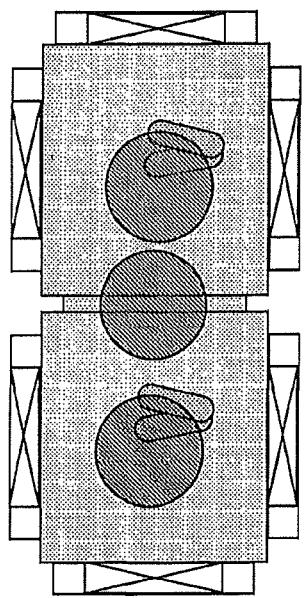

FIGS. 4A-4C illustrate how multiple transfer planes may be usefully employed to conserve floor space in a batch processing system. FIG. 4A shows a linking module including multiple transfer planes to accommodate single or multiple access to wafers within the linking module. Slot valves or the like are provided to isolate the linking module. FIG. 4B shows an alternative configuration in which multiple shelves are positioned between robots without isolation. In this configuration, the shelves may, for example, be positioned above the robots to permit a full range of robotic motion that might otherwise cause a collision between a robotic arm and wafers on the shelves. This configuration nonetheless provides batch processing and or multiple wafer buffering between robots. FIG. 4C shows a top view of the embodiment of FIG. 4B. As visible in FIG. 4C, the small adapter with shelves between robots in FIG. 4B permits relatively close positioning of two robots without requiring direct robot-to-robot handoffs. Instead each wafer or group of wafers can be transferred to the elevated shelves for subsequent retrieval by an adjacent robot. As a significant advantage, this layout reduces the footprint of two adjacent robots while reducing or eliminating the extra complexity of coordinating direct robot-to-robot handoffs.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. Thus, while the invention has been disclosed in connection with the preferred embodiments shown and described in detail, various modifications and improvements thereon will become readily apparent to those skilled in the art. Accordingly, the spirit and scope of the present invention is not to be limited by the foregoing examples, but is to be understood in the broadest sense allowable by law.

What is claimed is:

1. A vacuum handling robot for a vacuum processing system, the vacuum handling robot comprising:
    a multifaceted chamber having a base with a center axis and being configured so that each facet of the multifaceted chamber on no more than one side of the center axis is configured to couple to both batch processing modules and single-substrate processing modules;
    a first robotic arm rotatably coupled to the base and a drive section, the first robotic arm including a single-substrate end effector and the drive section being configured to independently operate movement of the first robotic arm to each of the facets of the multifaceted chamber;
    a second robotic arm rotatably coupled to the base and the drive section, the second robotic arm including a batch end effector including a plurality of vertically-stacked end effectors in a fixed orientation relative to one another and the drive section being configured to independently operate movement of the second robotic arm to each of the facets of the multifaceted chamber; and
    a controller including a neural network scheduler, the controller including the neural network scheduler being configured to coordinate movement of the first and second robotic arms within the vacuum processing system, where the neural network scheduler
    coordinates movement of the first robotic arm for accessing at least the single-substrate processing modules and
    coordinates movement of the second robotic arm for accessing the batch processing modules, and
    coordinates movement of the first robotic arm and the second robotic arm through a common opening of the multifaceted chamber.

2. The vacuum handling robot of claim 1 wherein the first robotic arm is a two-link SCARA unit.

3. The vacuum handling robot of claim 1 wherein the second robotic arm is a two-link SCARA unit.

4. The vacuum handling robot of claim 1 wherein at least one of the first robotic arm and the second robotic arm has z-movement capability.

5. The vacuum handling robot of claim 1 wherein a first link of the first robotic arm and a first link of the second robotic arm have a fixed rotational orientation to one another with respect to the center axis of the base.

6. The vacuum handling robot of claim 1 wherein the batch end effector includes at least three vertically-stacked end effectors.

7. The vacuum handling robot of claim 1 wherein the batch end effector includes at least two side-by-side end effectors.

8. The vacuum handling robot of claim 1 wherein the plurality of vertically-stacked end effectors includes at least two vertically-aligned end effectors.

9. The vacuum handling robot of claim 1 wherein the plurality of vertically-stacked end effectors includes at least two vertically-offset end effectors.

10. The vacuum handling robot of claim 1 wherein the base is rotatable.

11. The vacuum handling robot of claim 1 further comprising a load lock sharing a vacuum environment with the vacuum handling robot and positioned within reach of at least one of the first robotic arm and the second robotic arm.

12. The vacuum handling robot of claim 1 further comprising a batch load lock sharing a vacuum environment with the vacuum handling robot and positioned within reach of at least one of the first robotic arm and the second robotic arm.

13. The vacuum handling robot of claim 1 wherein the single substrate processing module shares a vacuum environment with the vacuum handling robot and is positioned within reach of at least one of the first robotic arm and the second robotic arm.

14. The vacuum handling robot of claim 1 wherein the batch processing module shares a vacuum environment with the vacuum handling robot and is positioned within reach of at least one of the first robotic arm and the second robotic arm.

15. The vacuum handling robot of claim 1 further comprising a batch aligner sharing a vacuum environment with the vacuum handling robot and positioned within reach of at least one of the first robotic arm and the second robotic arm.

16. The vacuum handling robot of claim 1 wherein at least one of the first robotic arm and the second robotic arm is a telescoping arm.

* * * * *